(12) United States Patent
Yoon et al.

(10) Patent No.: US 6,222,787 B1
(45) Date of Patent: Apr. 24, 2001

(54) INTEGRATED CIRCUIT MEMORY DEVICES HAVING IMPROVED SENSE AND RESTORE OPERATION RELIABILITY

(75) Inventors: Sei-Seung Yoon, Seoul; Il-Man Bae; Gi-Hong Kim, both of Kyunggi-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/400,164

(22) Filed: Sep. 21, 1999

(Under 37 CFR 1.47)

(30) Foreign Application Priority Data

Sep. 24, 1998 (KR) .................................... 98-39814

(51) Int. Cl.$^7$ ...................................... G11C 7/00
(52) U.S. Cl. .................. 365/226; 365/207; 365/189.09
(58) Field of Search ................... 365/226, 207, 365/206, 193, 233.5, 196, 189.09

(56) References Cited

U.S. PATENT DOCUMENTS

| | | | |
|---|---|---|---|
| 4,975,877 | 12/1990 | Bell | 365/189.01 |
| 5,014,245 | 5/1991 | Muroka et al. | 365/194 |
| 5,592,429 | * 1/1997 | Hirata | 365/226 |
| 5,640,350 | 6/1997 | Iga | 365/186 |
| 5,646,565 | * 7/1997 | Tukidate | 365/233.5 |
| 5,694,361 | * 12/1997 | Uchida | 365/189.09 |
| 5,793,667 | 8/1998 | Schwee | 365/145 |

* cited by examiner

*Primary Examiner*—Tan T. Nguyen
(74) *Attorney, Agent, or Firm*—Myers Bigel Sibley & Sajovec

(57) ABSTRACT

Integrated circuit memory devices include a control circuit that generates an active first control pulse (e.g., PR) having a first duration, in response to an active strobe pulse (e.g., /RAS) that may be generated during a data reading operation. To improve the reliability of the data reading operation and any subsequent data restore operation, particularly when the duration of the active strobe pulse is relatively short, a pulse width extension circuit is provided. The pulse width extension circuit converts the active first control pulse into an active second control pulse (e.g., PAIVCE2) having a second duration greater than the first duration. This active second control pulse is then provided as a control input to an internal voltage generator. The internal voltage generator is provided to drive a first supply signal line (e.g., AIVC2) at a first supply voltage in response to the active second control pulse. The first supply signal line may be provided as an internal supply line to one or more active circuits within the memory device. The first supply signal line may power a differential sense amplifier during data reading and data restore operations (i.e., when data is being sensed and amplified on a pair of differential bit lines). These reading and restore operations may be performed with higher reliability if the additional pulse duration provided by the pulse width extension circuit is sufficient to enable a complete recharging of the differential bit lines of the sense amplifier while a data restore operation is being performed.

24 Claims, 8 Drawing Sheets

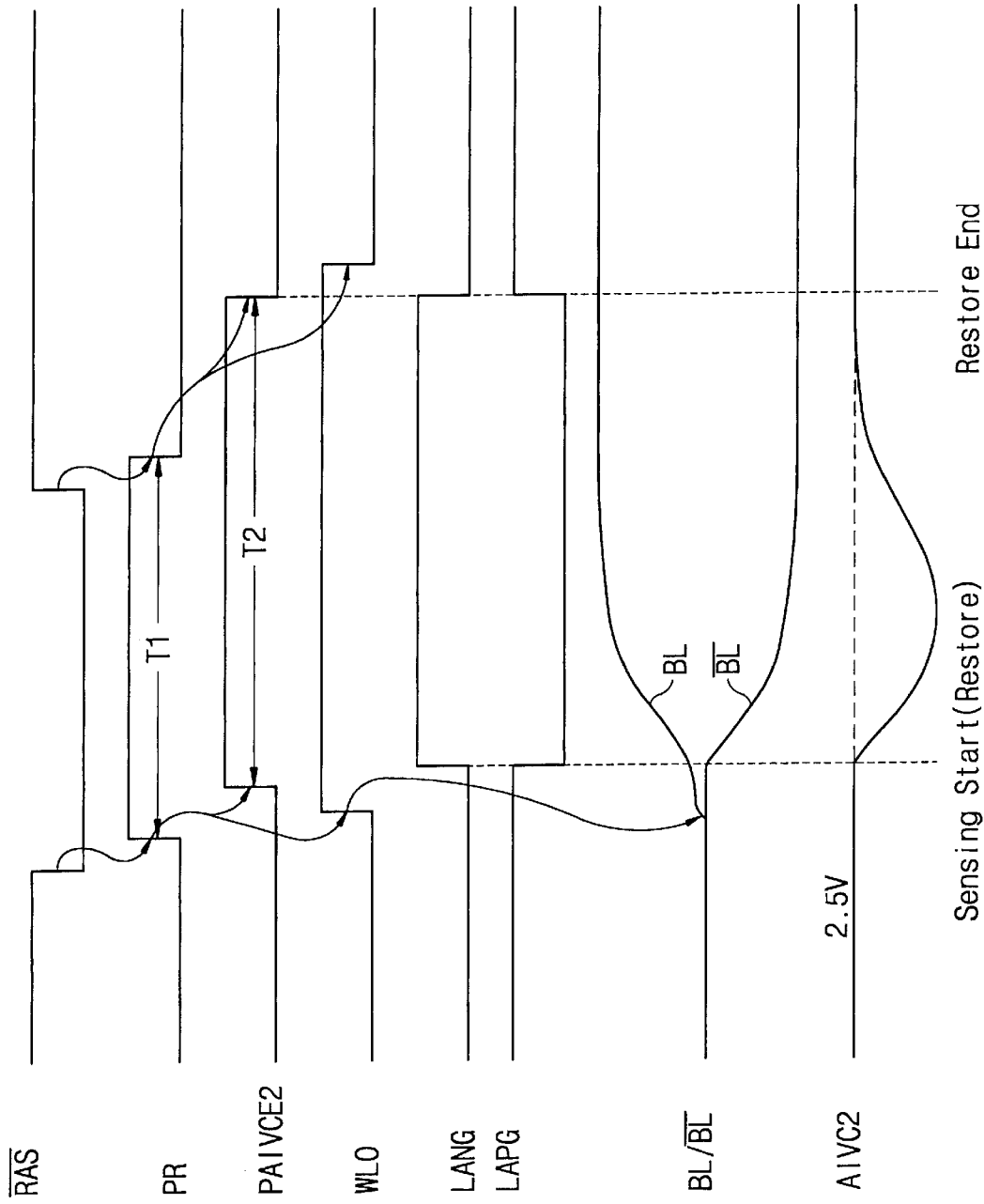

INTEGRATED CIRCUIT MEMORY DEVICES HAVING IMPROVED SENSE AND RESTORE OPERATION RELIABILITY

RELATED APPLICATION

This application is related to Korean Application No. 98-39814, filed Sep. 24, 1998, the disclosure of which is hereby incorporated herein by reference.

FIELD OF THE INVENTION

The present invention relates to integrated circuits, and more particularly to integrated circuit memory devices.

BACKGROUND OF THE INVENTION

Increases in the integration levels of integrated circuit memory devices may result in concomitant increases in the power consumption requirements of memory devices. Accordingly, attempts have been made to improve the power consumption efficiency of circuits that make up an integrated circuit memory device. Unfortunately, such attempts to improve power consumption efficiency may cause a reduction in the reliability of highly integrated memory devices.

FIG. 1 is a block diagram of a conventional integrated circuit memory device (e.g., DRAM device). As illustrated, the memory device includes control logic 80, an internal power supply voltage generator 90, a row address buffer 10, a column address buffer 20, a row decoder 30, a memory cell array 50, a sense amplifier 60, a column decoder 40, a data input buffer 70a and a data output buffer 70b. As illustrated by FIGS. 1–2, the internal power supply voltage generator 90 generates an internal supply voltage signal AIVC in response to an external supply voltage signal EVC. In particular, the internal power supply voltage generator 90 operates to actively pull up signal line AIVC when signal line PAIVCE is set to a logic 1 level, however, when signal line PAIVCE is set to a logic 0 level, the internal power supply voltage generator 90 does not supply pull-up current to signal line AIVC. The logic 1 pulse width of signal PAIVCE is typically directly related to the active pulse width of the row address strobe signal /RAS. As illustrated by FIG. 2, increases in the external supply voltage EVC above a predetermined clamping level (e.g., 2.5 volts) will not result in further corresponding increases in the magnitude of the signal provided to signal line AIVC.

Referring now to FIG. 3, an operation to read data from a memory cell within the array 50 includes the step of driving a corresponding word line WL to an active level (i.e., logic 1 level). In response, charge from within the memory cell will be transferred to a corresponding bit line BL and the bit line will rise slightly in potential. If the sense amplifier 60 is active (LANG=1, LAPG=0), the sense amplifier will use current provided by signal line AIVC to amplify and drive the differential bit lines BL and /BL to opposite logic levels, as illustrated. During this amplification operation, the voltage level on signal line AIVC may drop. Moreover, because the internal power supply voltage generator 90 may only operate to actively pull-up signal line AIVC while signal line PAIVCE is at a logic 1 level, the signal line AIVC may not return to a voltage level of 2.5 volts at the time the signal line PAIVCE transitions from 1–0. The reduction is illustrated by the amount "ΔV". If this happens, the differential bit lines may not be driven to their full rail-to-rail levels and the reliability of data restore operations (when charge is transferred back into the selected memory cells to restore the data therein) may be reduced. This likelihood of reduced reliability may also be increased if the duration of the active row address strobe signal /RAS is decreased to achieve higher frequency of operation. Thus, notwithstanding attempts to develop more highly integrated memory devices, there continues to be a need for memory devices that can be more reliable when operating at relatively low voltage levels and at high frequencies.

SUMMARY OF THE INVENTION

It is therefore an object of the present invention to provide improved integrated circuit memory devices.

It is another object of the present invention to provide integrated circuit memory devices that can provide highly reliable data reading and data restore operations notwithstanding low voltage and/or high frequency operation.

These and other objects, advantages and features of the present invention can be provided by integrated circuit memory devices that preferably include a control circuit that generates an active first control pulse (e.g., PR) having a first duration, in response to an active strobe pulse (e.g., /RAS) that may be generated during a data reading operation. To allow improved reliability of the data reading operation and any subsequent data restore operation, particularly when the duration of the active strobe pulse is relatively short, a pulse width extension circuit is provided. The pulse width extension circuit converts the active first control pulse into an active second control pulse (e.g., PAIVCE2) having a second duration greater than the first duration. This active second control pulse is then provided as a control input to an internal voltage generator. In particular, the internal voltage generator is provided to drive a supply signal line (e.g., AIVC2) at a first supply voltage in response to the active second control pulse. The supply signal line may be provided as an internal supply line to one or more active circuits within the memory device.

For example, the supply signal line may be used to power a differential sense amplifier during data reading and data restore operations (i.e., when data is being sensed and amplified on a pair of differential bit lines). According to a preferred aspect of the present invention, these reading and restore operations may be performed with higher reliability if the additional pulse duration provided by the pulse width extension circuit is sufficient to enable a complete recharging of the differential bit lines of the sense amplifier prior to performance of a data restore operation.

BRIEF DESCRIPTION OF THE DRAWINGS

FIG. 8 is a timing diagram that illustrates operation of the device of FIG. 4.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 4:
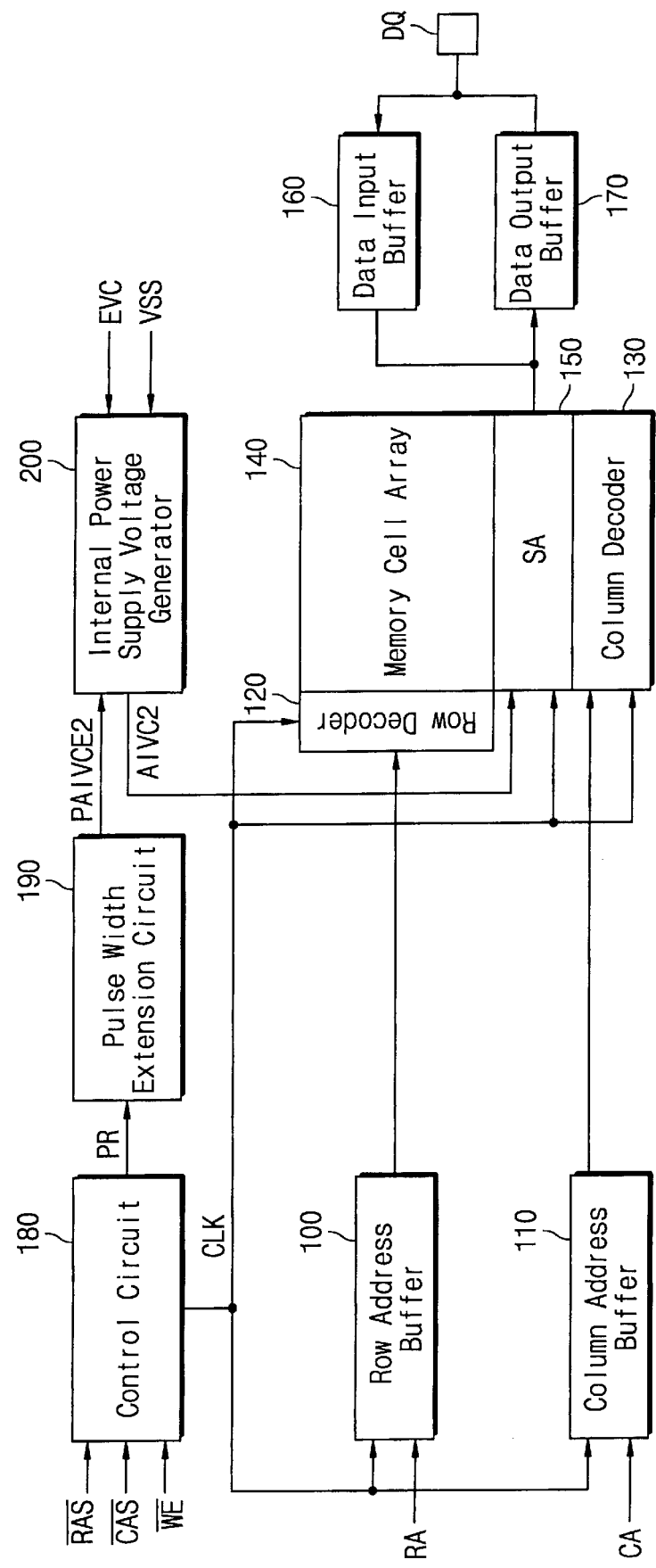
FIG. 4 is a block diagram of an integrated circuit memory device according to an embodiment of the present invention.

Referring now to FIG. 4, an integrated circuit memory device according to a preferred embodiment of the present invention will be described. As illustrated, a control circuit 180 is provided to, among other things, generate an active first control pulse (PR) having a first duration (T1), in response to an active strobe pulse. As illustrated best by FIG. 8, this active first control pulse (PR) may be generated in response to an active row address strobe signal (/RAS). As will be understood by those skilled in the art, an active row address strobe signal (/RAS) is typically provided as a logic 0 pulse. This logic 0 pulse then initiates a data reading operation by, among other things, driving one or more word lines within the memory device with signals that turn on access transistors within memory cells. The duration of the active row address strobe signal (/RAS) may be inversely related to the frequency at which the memory device operates. The control circuit 180 may also be responsive to a column address strobe signal (/CAS) and a write enable signal (/WE) and operate in-sync with a clock signal (CLK).

A row address buffer 100 and a column address buffer 110 are also provided. The row address buffer 100 buffers a row address (RA) and provides buffered row addresses to a row decoder 120. Similarly, the column address buffer 110 buffers a column address (CA) and provides buffered column addresses to a column decoder 130. As will be understood by those skilled in the art, the row decoder 120 is electrically coupled to word lines within a highly integrated memory cell array 140. A sense amplifier 150 is also provided. The sense amplifier 150 may be electrically coupled to the memory cell array 140 by a plurality of pairs of differential bit lines (BL and /BL) and electrically coupled to a column decoder 130, as illustrated. The column decoder 130 may provide column select circuitry that enables read data to be passed from the differential bit lines to input/output lines (IO and /IO that are coupled to a data output buffer 170) and enables write data to be passed from a data input buffer 160 to the bit lines.

Figure 5:
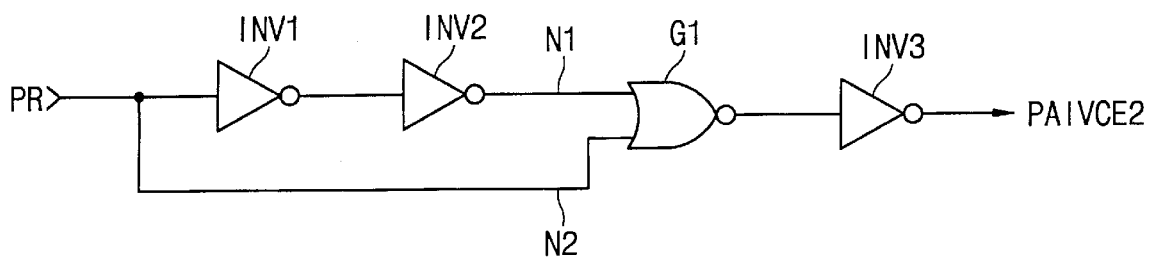
FIG. 5 is an electrical schematic of a preferred pulse width extension circuit, according to the device of FIG. 4.

Referring still to FIG. 4, a preferred pulse width extension circuit 190 is also provided. The pulse width extension circuit 190 performs the function of converting the active first control pulse (PR) into an active second control pulse (PAIVCE2) having a second duration (T2) greater than the first duration (T1). As illustrated by FIG. 5, the pulse width extension circuit 190 preferably comprises a pair of delay inverters INV1 and INV2 electrically connected in series, a NOR gate G1 and an output inverter INV3. As will be understood by those skilled in the art, the pair of delay inverters INV1 and INV2 operate in combination with the boolean OR operation provided by the NOR gate G1 and inverter INV3, to provide an active second control pulse (PAIVCE2) (e.g., logic 1 pulse) having a greater duration than the duration of the active first control pulse (PR). In particular, a leading 0→1 transition on signal line PR will result in a corresponding 0→1 transition on signal line PAIVCE2, however, a trailing 1→0 transition on signal line PR will result in a delayed 1→0 transition on signal line PAIVCE2 because node N1 will remain at a logic 1 level for some time after node N2 transitions to a logic 0 level. The additional duration is equivalent to the delay provided by inverters INV1 and INV2. It will also be understood that other pulse extension circuits may be used.

Figure 6:
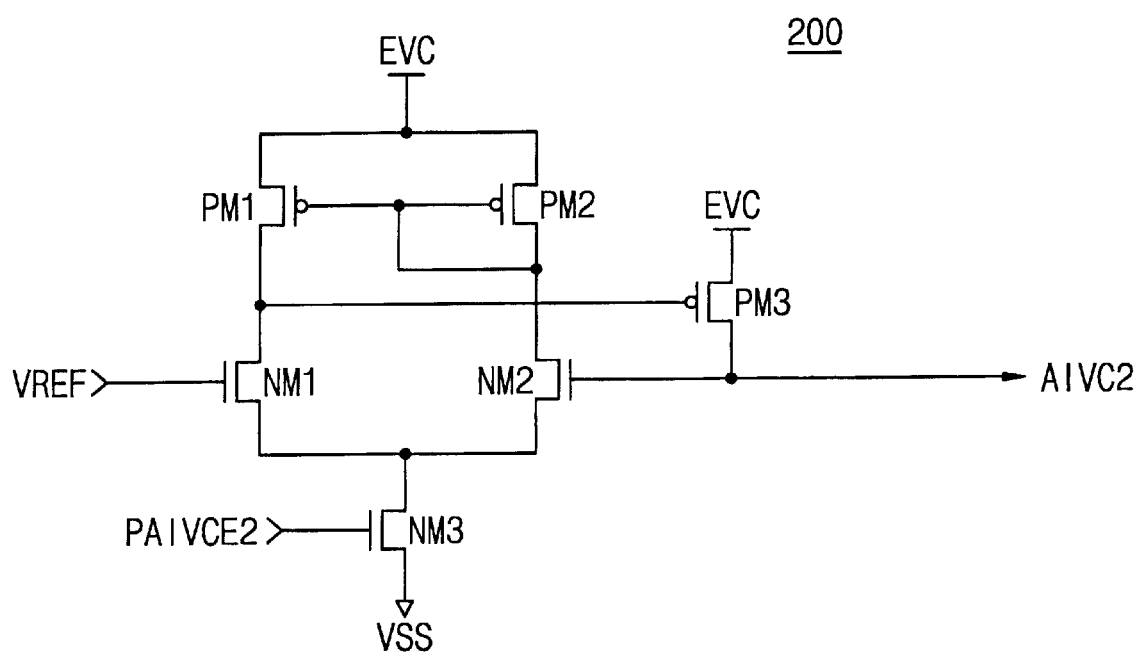
FIG. 6 is an electrical schematic of a preferred internal voltage generator, according to the device of FIG. 4.

The active second control pulse PAIVCE2 is provided as a control input to an internal power supply voltage generator 200. As illustrated best by FIGS. 4 and 6, the internal power supply voltage generator 200 preferably comprises a differential amplifier and a driver circuit. The differential amplifier has first and second differential inputs that are provided by the gate electrodes of NMOS transistors NM1 and NM2 and first and second differential outputs that are provided by the drain electrodes of NMOS transistors NM1 and NM2. The differential amplifier also comprises an NMOS pull-down transistor NM3 that operates as a current source and PMOS pull-up transistors PM1 and PM2. The source electrode of the NMOS pull-down transistor NM3 is electrically coupled to a ground reference signal line Vss. The driver circuit comprises a PMOS pull-up transistor PM3 that has a gate electrode electrically connected to the first differential output and a source electrode electrically connected to the output (signal line AIVC2) and the gate electrode of NMOS transistor NM2 (i.e., the second differential input). A reference voltage VREF is also provided to the gate electrode of NMOS transistor NM1. The differential amplifier and driver circuit are both powered by an external power supply signal line EVC. Other power supply voltage generator circuits may also be used.

As will be understood by those skilled in the art, the PMOS pull-up transistor PM3 operates to supply current to the output (AIVC2) of the internal power supply voltage generator 200 whenever the potential of the output drops below the potential of the reference voltage VREF and the NMOS pull-down transistor (acting as a current source) is conductive (i.e., the active second control pulse PAIVCE2 is being applied to the gate electrode of NMOS transistor NM3).

Figure 1:
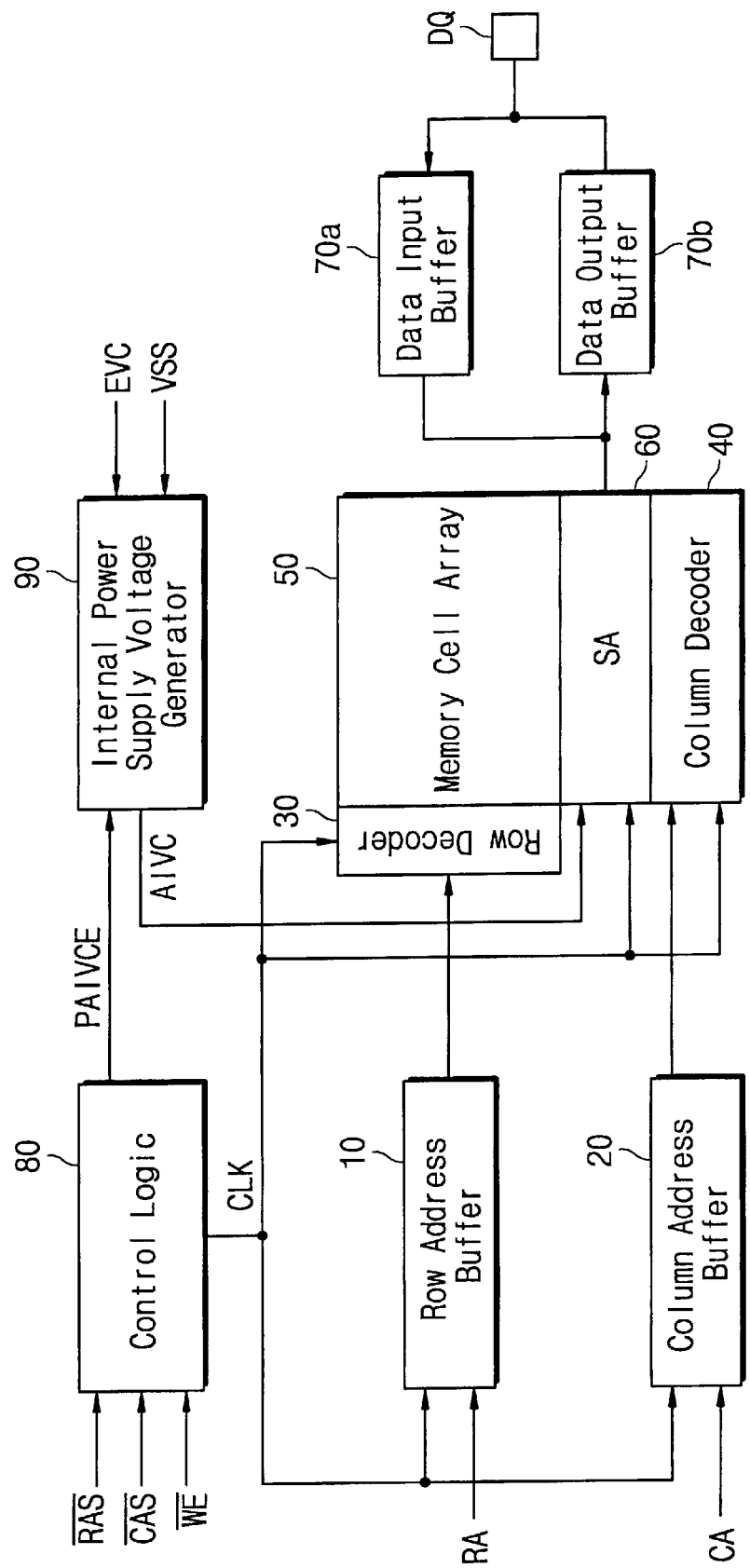
FIG. 1 is a block diagram of an integrated circuit memory device according to the prior art.
Figure 2:
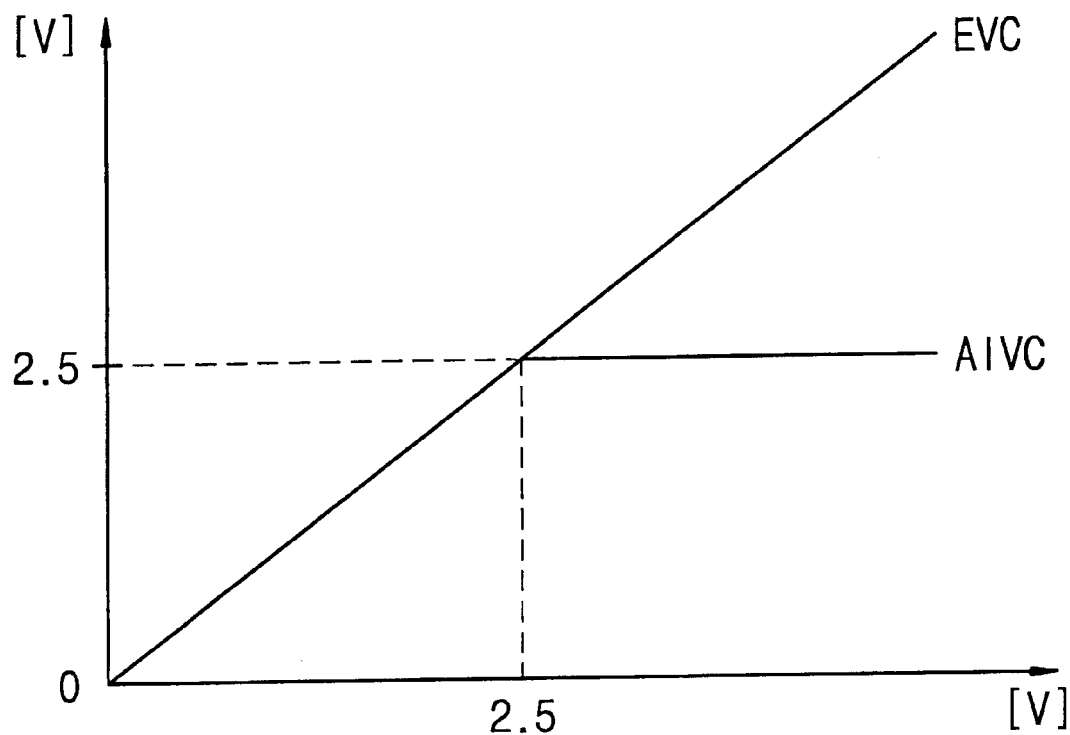
FIG. 2 is a graph that illustrates a relationship between an external power supply reference voltage (EVC) and an internal power supply reference voltage (AIVC) according to the prior art.
Figure 3:
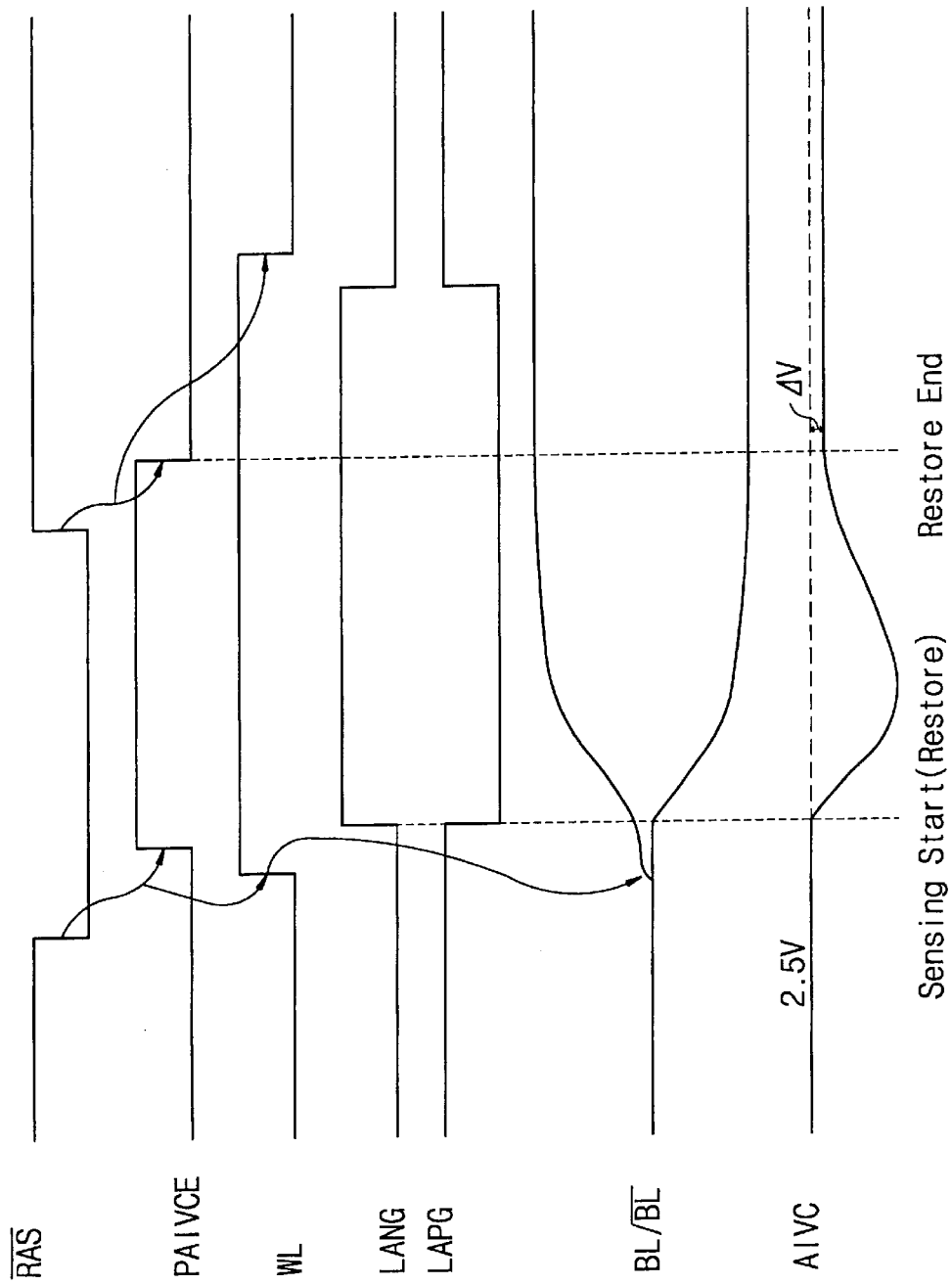
FIG. 3 is a timing diagram that illustrates operation of the device of FIG. 1.
Figure 7:
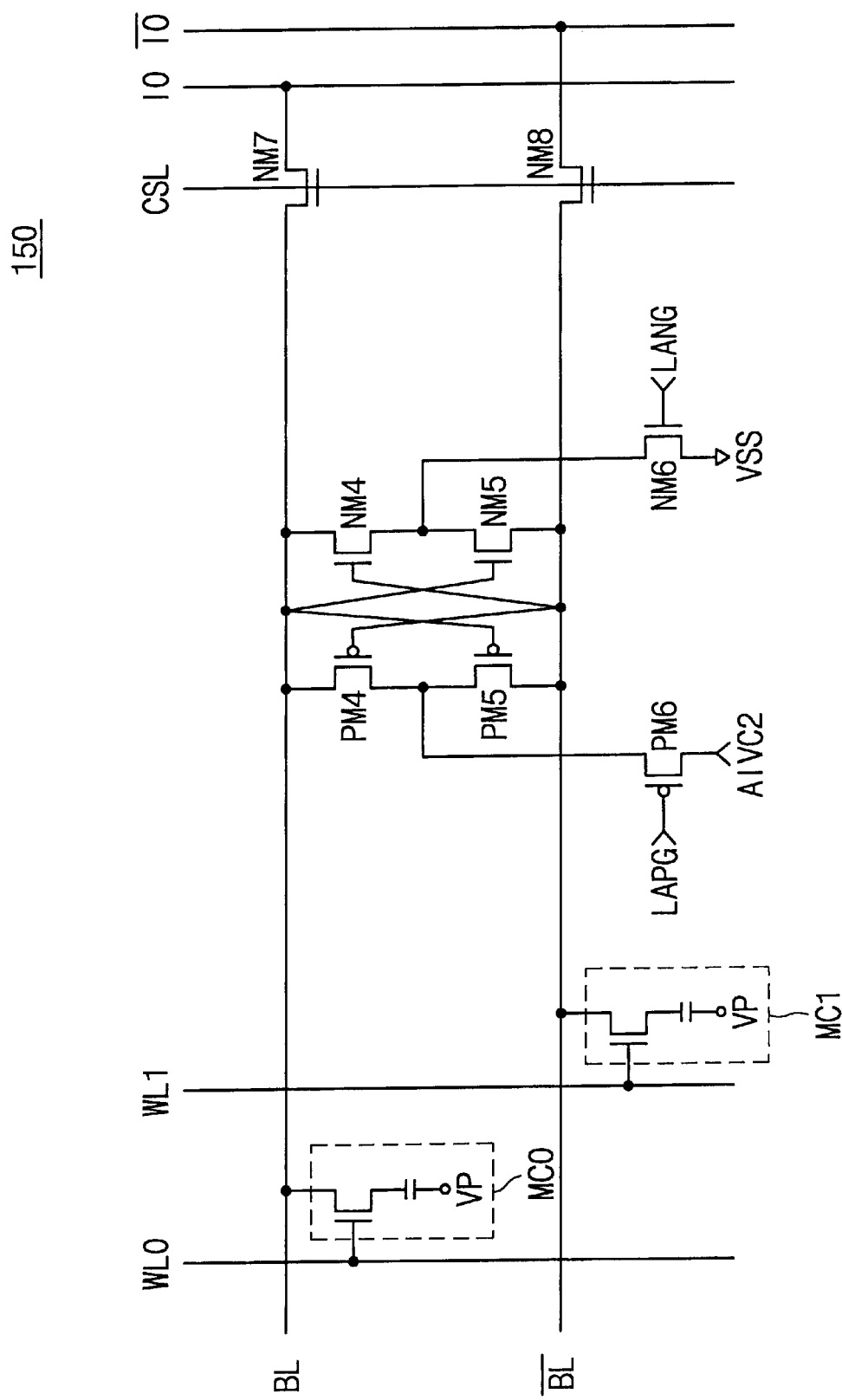
FIG. 7 is an electrical schematic of a preferred differential sense amplifier, according to the device of FIG. 4.

Referring now to FIGS. 7 and 8, an operation to read data from the zeroth memory cell MC0 (storing logic 1 data) takes place by driving the zeroth word line WL0 to a logic 1 level in response to an active row address strobe signal. When this occurs, a relatively small amount of charge will be provided to the bit line BL (but not the complementary bit line /BL). This small amount of charge will cause the potential of the bit line BL to rise slightly above the corresponding complementary bit line /BL. Because both the PMOS pass transistor PM6 and NMOS pass transistor NM6 are conductive (LAPG and LANG are set to logic 0 and logic 1 levels, respectively), and because the output of the voltage generator 200 (signal line AIVC2) is set at 2.5 volts, the PMOS and NMOS sense amplifiers will operate to amplify the differential potential established across the bit lines BL and /BL. The PMOS and NMOS sense amplifiers are formed by PMOS transistors PM4 and PM5 and NMOS transistors NM4 and NM5. This amplification operation will cause the voltage level at the output of the voltage generator 200 to drop as a relatively large amount of charge is transferred from signal line AIVC2 to the bit line BL during the amplify operation. But, because the duration of the active second control pulse PAIVCE2 is relatively long compared to the duration of pulse PAIVCE illustrated by FIG. 3, the PMOS pull-up transistor PM3 will remain conductive longer and thereby charge the bit line BL fully to a logic 1 level. This higher logic 1 level on the bit line BL will result in improved restore efficiency when the logic 1 level is written back into the zeroth memory cell MC0. Accordingly, the present invention advantageously uses a pulse width extension circuit to allow improved device reliability.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a control circuit that generates an active first control pulse having a first duration in response to an active strobe signal;
   a pulse width extension circuit that converts the active first control pulse into an active second control pulse having a second duration greater than the first duration;
   an internal voltage generator that drives an output thereof at a first supply voltage in response to the active second control pulse;
   a differential sense amplifier having a supply signal line electrically coupled to the output of the internal voltage generator; and
   at least one memory cell that is electrically coupled to said differential sense amplifier.

2. The memory device of claim 1, wherein said internal voltage generator comprises:
   a differential amplifier having first and second differential inputs and first and second differential outputs; and
   a pull-up transistor having a gate electrode electrically coupled to the first differential output and a source electrode electrically coupled to the second differential input.

3. The memory device of claim 2, wherein said differential amplifier comprises a current source circuit that is responsive to the active second control pulse.

4. The memory device of claim 3, wherein the current source circuit comprises a transistor having a gate electrode electrically coupled to an output of said pulse width extension circuit.

5. The memory device of claim 4, wherein said pulse width extension circuit comprises:
   a delay circuit having an input that receives the active first control pulse from said control circuit; and
   a logic gate having a first input electrically coupled to the input of said delay circuit and a second input electrically coupled to an output of said delay circuit.

6. The memory device of claim 5, wherein said logic gate is selected from the group consisting of OR gates and NOR gates.

7. The memory device of claim 6, wherein said differential sense amplifier comprises:
   a sense amplifier having first and second control inputs;
   a pass transistor electrically connected in series between the supply signal line and a supply node of said sense amplifier.

8. The memory device of claim 7, wherein the supply signal line is electrically connected to the source electrode of said pull-up transistor.

9. The memory device of claim 3, wherein the supply signal line is electrically connected to the source electrode of said pull-up transistor.

10. The memory device of claim 1, wherein said pulse width extension circuit comprises:
    a delay circuit having an input that receives the active first control pulse from said control circuit; and
    a logic gate having a first input electrically coupled to the input of said delay circuit and a second input electrically coupled to an output of said delay circuit.

11. The memory device of claim 10, wherein said logic gate is selected from the group consisting of OR gates and NOR gates.

12. The memory device of claim 1, wherein said differential sense amplifier comprises:
    a PMOS sense amplifier having first and second control inputs;
    a PMOS pass transistor electrically connected in series between the supply signal line and a supply node of said PMOS sense amplifier.

13. The memory device of claim 1, wherein the active strobe signal is a row address strobe signal.

14. A dynamic random access memory device, comprising:
    a control circuit that generates an active first control pulse having a first duration in response to a row address strobe signal;
    a pulse width extension circuit that converts the active first control pulse into an active second control pulse having a second duration greater than the first duration;
    an internal voltage generator that drives an output thereof at a first supply voltage in response to the active second control pulse; and
    a differential sense amplifier having a supply signal line electrically coupled to the output of the internal voltage generator.

15. The memory device of claim 14, wherein said internal voltage generator comprises:
    a differential amplifier having first and second differential inputs and first and second differential outputs; and
    a pull-up transistor having a gate electrode electrically coupled to the first differential output and a source electrode electrically coupled to the second differential input.

16. The memory device of claim 15, wherein said differential amplifier comprises a current source circuit that is responsive to the active second control pulse.

17. The memory device of claim 16, wherein the current source circuit comprises a transistor having a gate electrode electrically coupled to an output of said pulse width extension circuit.

18. The memory device of claim 17, wherein said pulse width extension circuit comprises:
    a delay circuit having an input that receives the active first control pulse from said control circuit; and
    a logic gate having a first input electrically coupled to the input of said delay circuit and a second input electrically coupled to an output of said delay circuit.

19. The memory device of claim 18, wherein said logic gate is selected from the group consisting of OR gates and NOR gates.

20. The memory device of claim 19, wherein said differential sense amplifier comprises:
    a PMOS sense amplifier having first and second control inputs;
    a PMOS pass transistor electrically connected in series between the supply signal line and a supply node of said PMOS sense amplifier.

21. An integrated circuit memory device, comprising:

means, responsive to a row address strobe signal, for generating an active first control pulse having a first duration;

means for converting the active first control pulse into an active second control pulse having a second duration greater than the first duration;

means, responsive to the active second control pulse, for generating a supply voltage on a supply signal line;

a differential sense amplifier electrically coupled to the supply signal line; and at least one memory cell electrically coupled to said differential sense amplifier.

22. The memory device of claim 21, wherein said generating means comprises:

a differential amplifier having first and second differential inputs and first and second differential outputs; and a pull-up transistor having a gate electrode electrically coupled to the first differential output and a source electrode electrically coupled to the second differential input.

23. The memory device of claim 22, wherein said differential amplifier comprises a current source circuit that is responsive to the active second control pulse.

24. The memory device of claim 23, wherein said converting means comprises:

a delay circuit having an input that receives the active first control pulse; and a logic gate having a first input electrically coupled to the input of said delay circuit and a second input electrically coupled to an output of said delay circuit.

* * * * *